United States Patent [19]
Fudim

[11] Patent Number: 5,171,490
[45] Date of Patent: * Dec. 15, 1992

[54] METHOD AND APPARATUS FOR PRODUCTION OF THREE-DIMENSIONAL OBJECTS BY IRRADIATION OF PHOTOPOLYMERS

[76] Inventor: Efrem V. Fudim, 4815 N. Marlborough Dr., Milwaukee, Wis. 53217

[ * ] Notice: The portion of the term of this patent subsequent to Jun. 21, 2005 has been disclaimed.

[21] Appl. No.: 531,182

[22] Filed: May 31, 1990

Related U.S. Application Data

[63] Continuation-in-part of Ser. No. 277,226, Nov. 29, 1988.

[51] Int. Cl.$^5$ .............................................. B29C 35/08
[52] U.S. Cl. ..................................... 264/22; 264/308; 425/174.4; 430/270
[58] Field of Search ............... 425/174.4, 174; 264/22, 264/308; 427/54.1, 53.1, 55; 430/270

[56] References Cited

U.S. PATENT DOCUMENTS

| | | | |
|---|---|---|---|
| 3,597,295 | 8/1971 | Tenquist | 425/174.4 X |
| 3,689,346 | 9/1972 | Rowland | 425/174.4 X |
| 4,407,646 | 10/1983 | Bricot et al. | 425/174.4 |
| 4,575,330 | 3/1986 | Hull | 425/174.4 |
| 4,587,066 | 5/1986 | Rodriguez | 425/174.4 X |
| 4,752,498 | 6/1988 | Fudim | 427/54.1 |
| 4,960,624 | 10/1990 | Ueno | 264/22 X |
| 4,961,154 | 10/1990 | Pomerantz et al. | 264/22 X |

*Primary Examiner*—Richard L. Chiesa
*Attorney, Agent, or Firm*—Quarles & Brady

[57] ABSTRACT

An improved method of preparing three-dimensional objects from uncured photopolymer by depositing the photopolymer in layers and treating it with radiation to convert the photopolymer into a cohesive structure capable of being at least partially unsupported includes irradiating the uncured photopolymer by transmitting radiation through a constrained radiation transmittent flexible film. Apparatus for performing the method is disclosed.

37 Claims, 4 Drawing Sheets

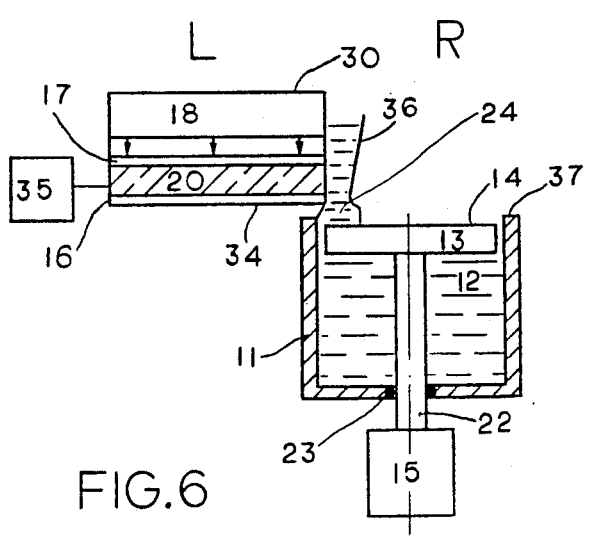
FIG. 6
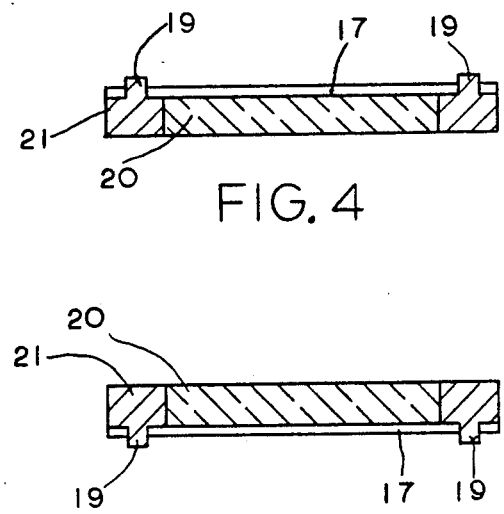
FIG. 4
FIG. 5
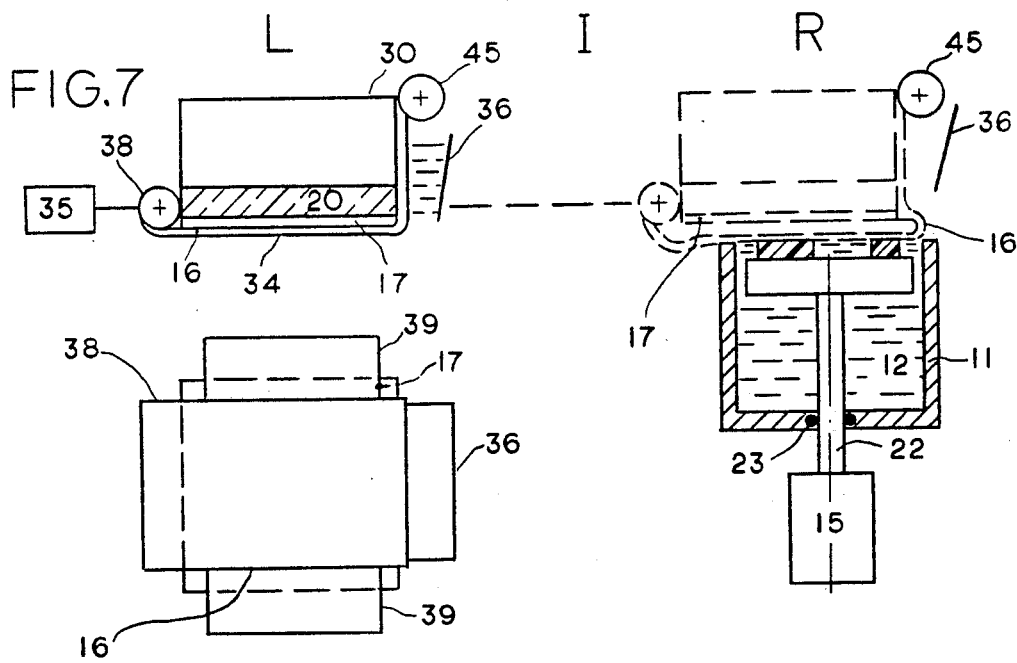
FIG. 7
FIG. 8 ical objects. More specifically, it relates to a method and apparatus for forming three-dimensional objects by the selective irradiation of liquid photopolymers or similar materials that in response to radiation will solidify or form an adequately cohesive layer of structure capable of being partially unsupported by any other structure. The irradiation is controlled by the configuration of the object to be formed that can be provided by a computer-aided-design (CAD) system opening the way to automatic computer controlled fabrication. No machining tools, etching or molding is employed, and the technology is referred to as toolless manufacturing, desk-top manufacturing, rapid prototyping, or stereolithography.

METHOD AND APPARATUS FOR PRODUCTION OF THREE-DIMENSIONAL OBJECTS BY IRRADIATION OF PHOTOPOLYMERS

RELATED CASE

This application is a continuation-in-part of my earlier copending application Ser. No. 277,226 filed Nov. 29, 1988.

RELATED DISCLOSURE STATEMENT

Disclosure documents Nos. 241,511 and 241,886 describing the invention were filed with the U.S. Patent Office on Dec. 15 and Dec. 21, 1989.

FIELD OF THE INVENTION

This invention relates generally to improvements in a method and apparatus for the production of three-dimensional objects. More specifically, it relates to a method and apparatus for forming three-dimensional objects by the selective irradiation of liquid photopolymers or similar materials that in response to radiation will solidify or form an adequately cohesive layer of structure capable of being partially unsupported by any other structure. The irradiation is controlled by the configuration of the object to be formed that can be provided by a computer-aided-design (CAD) system opening the way to automatic computer controlled fabrication. No machining tools, etching or molding is employed, and the technology is referred to as toolless manufacturing, desk-top manufacturing, rapid prototyping, or stereolithography.

BACKGROUND OF THE INVENTION

Several methods and apparatus have been developed for the production of three-dimensional objects by irradiating photopolymer layer upon layer. To provide adequate accuracy of the side surfaces of the objects, the layers must be thin and, hence, in many cases hundreds and thousands of layers of liquid photopolymer must be deposited and irradiated to form an object. In addition, these processes must be fast to assure required productivity. Unfortunately, polymer liquids are quite viscous and their deposition in thin layers by liquid flow can take significant time. Furthermore, distortion during photopolymer solidification has to be minimized.

Forming each layer point by point by irradiation of an open photopolymer surface using a laser as disclosed in U.S. Pat. No. 4,575,330 can be slow and inaccurate due to irradiation by the scanning of a single point at a time, because irradiated polymer is not constrained and warps during irradiation, and since free flow of polymer is used for deposition. The method and apparatus disclosed in my U.S. Pat. No. 4,752,498 for forming whole layers of any size simultaneously while the layer is constrained is free of these drawbacks and provides much higher production rates and accuracy. However, simplification of the apparatus and further improvements in speed and accuracy of fabrication are desirable.

With most known methods, objects are formed in a container filled with a liquid polymer which precludes full cure due to accompanying distortion of underlying preceding layers, and hence necessitates additional cure after the object is formed, as well as the building of supports for overhangs since they are not strong enough to support themselves in the liquid. Postcuring often brings distortion not only through polymer shrinkage but also through warpage which is especially severe in asymmetrical and thin-wall objects.

The formation of objects in containers of liquid makes it difficult to vary polymer material from layer to layer as is required for such objects as aircraft-automobile instrument panels that incorporate several materials with different mechanical, electrical, optical, etc. properties.

SUMMARY OF THE INVENTION

The primary objects of this invention are to provide an improved method and apparatus for making three-dimensional objects by the photosolidification of photopolymers or similar materials. This is accomplished by irradiation through a flexible radiation-transmittent film in contact with the irradiated polymer, said film being constrained during irradiation with a rigid radiation-transmittent plate. Owing to film flexibility, its separation which is necessary for further polymer deposition can be achieved by simply peeling or pulling the film from the object with little object distortion.

It is also an object of this invention to disclose a method for speeding up and simplifying the deposition of liquid polymer, especially for thin layers, which is achieved by pushing the polymer into place with a flexible film, or by pulling the object and film apart in a sealed container.

Another object of this invention is to decrease distortion in the final object which can be caused by radiation penetrating into the polymer beyond the layer being formed. This is achieved in the present invention by conducting the irradiation so that there is no liquid polymer behind the layer being irradiated. In one embodiment disclosed, the layer is deposited apart from the object; irradiated apart from the object and/or unsolidified polymer is removed from each formed layer before further irradiation.

Still another object of the invention is elimination of postcure and supports for overhangs, as well as, shrinkage and warpage distortion accompanying posture. This is done by completely curing layers which are free of any excess liquid polymer behind them.

Still another object is to disclose a method having the capability of efficient fabricating objects having different materials in different layers. This can be accomplished by using individual dispensing means that deposit the different materials directly onto the irradiation means apart from the object, and preferably without doing the irradiation in a container filled with polymer.

BRIEF DESCRIPTION OF THE DRAWINGS

In the drawings:

FIGS. 4 and 5 are cross-sectional views of mask aligning means;

FIG. 6 is a second embodiment of my invention;

FIG. 7 is a third embodiment of my invention;

FIG. 8 is a bottom view of an embodiment of an irradiation means;

DESCRIPTION OF THE PREFERRED EMBODIMENT

Figure 1:
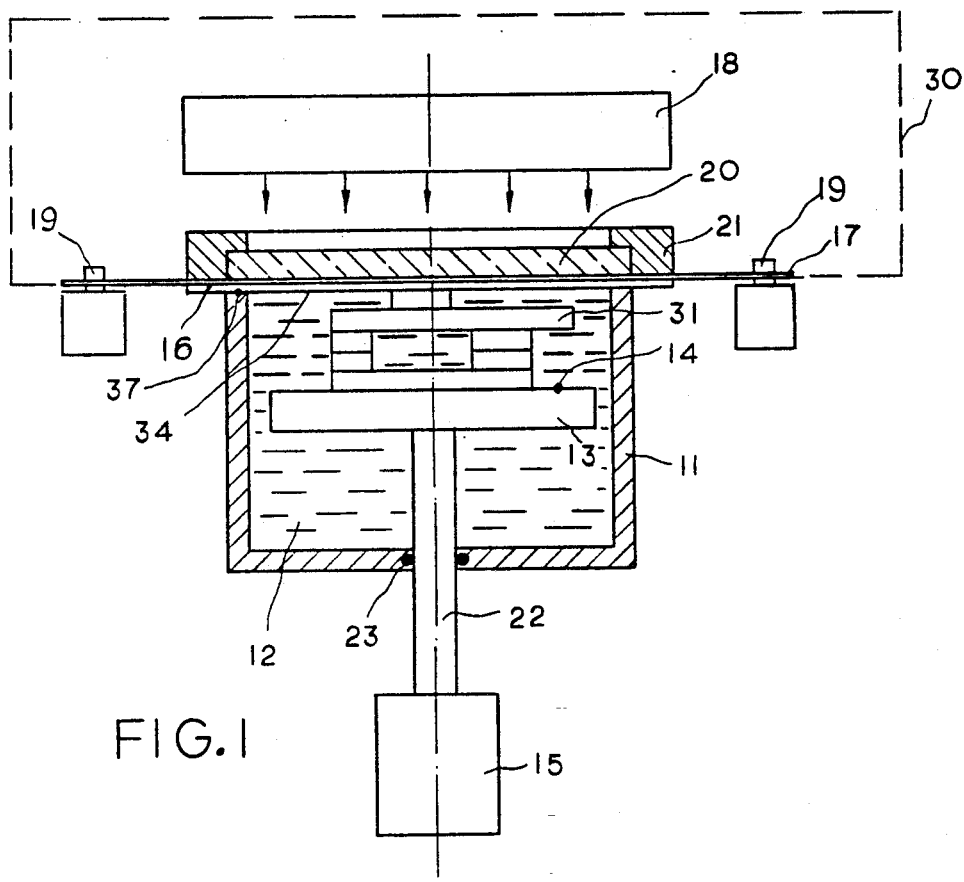
FIG. 1 is a view, partly in section, of a preferred embodiment of an apparatus for practicing my invention.

The apparatus of FIG. 1 includes container 11 filled with photopolymer 12 and having a flat top 37. Substrate 13 having a flat top surface 14 that is preferably parallel to the top 37 is positioned in container 11. Vertical positioning of substrate 13 is done by positioner 15 via shaft 22 and seal 23. Radiation-transmittent film 16 covers top surface of the photopolymer 12 during the irradiation.

Film 16 is made preferably of a material that preserves further cross-linking capability of irradiated photopolymer so that next layer formed on top of the first layer will attach thereto (see U.S. Pat. No. 4,752,498). Film 16 is thin for minimal distortion of the irradiation pattern. It is stretched and flexible and provides a flat radiation-emitting surface 34. The film 16 has low adhesion to irradiated photopolymer so that it can be peeled off with minimal distortion of the solidified photopolymer.

The irradiation is provided using a mask 17 having transparent areas where the photopolymer 12 should solidify, and source of uniform radiation 18 positioned to transmit radiation through the mask 17. Proper alignment of formed layers of polymer can be accomplished using irradiation means pins 19 in combination with orifices (not shown) in the masks 17 that match the pins 19 in size and mutual disposition, and are identically positioned on all masks in relation to their patterns.

To eliminate warpage during irradiation, a flat rigid radiation-transmittent plate 20 with heavy frame 21 is placed over mask 17. Other means can be employed for limiting displacement of film 16 upwards so that bulging of solidifying photopolymer beyond the top surface of container 11 is minimized.

Figure 2:
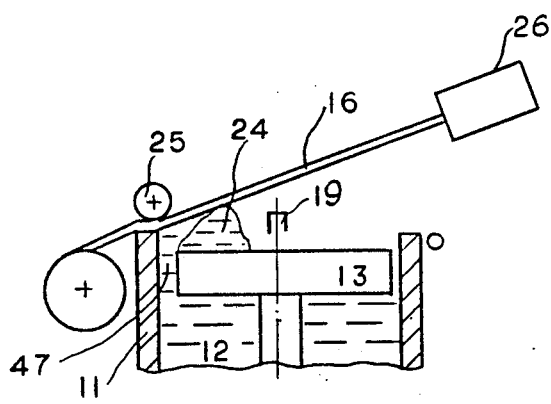
FIG. 2 is a side view, partly in section, of a portion of FIG. 1 illustrating photopolymer layer deposition.
Figure 3:
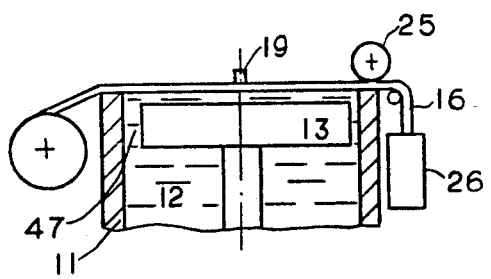
FIG. 3 is a view like FIG. 2.

The apparatus operates as follows. Using the positioner 15, the substrate 13 is positioned at a distance from surface 34 equal to thickness of the layer to be formed. The photopolymer 12 is deposited onto substrate 13 in a flat layer terminating at surface 34 and it is covered with a stretched film 16 with no gas entrapped. This can be done as shown in FIG. 2 by dispensing an excessive quantity 24 of liquid photopolymer 12 and using the film 16 to push it into place. As seen in FIGS. 2 and 3 the polymer quantity 24 is covered with film 16 secured on one end below the top 37 and, pushed into place while stretching the film, spreading and flattening the photopolymer 24 by rolling the film 16 with a roller 25. For irradiation, the film 16 is kept stretched using weight 26 as shown in FIG. 2. Additional means for stretching the film 16 in a perpendicular direction also can be used.

Returning to FIG. 1, it can be seen that a proper mask 17 is placed over film 16 with its orifices over the pins 19; and a plate 20 secured in frame 21 is placed over the mask 17 to press the mask 17 together with film 16 onto the top of the photopolymer 12. Irradiation is provided to solidify the layer and attach it to substrate 13. When the irradiation is completed, plate 20 with frame 21 and mask 17 are removed and the film 16 is peeled off the surface of the now irradiated polymer by folding and pulling back on end 26 (seen in FIGS. 2 and 3).

The above steps are repeated for the formation and attachment to the object of subsequent layers.

When all the layers are formed, substrate 13 is raised and the solidified object is freed from unsolidified photopolymer using suitable solvent and/or heat. It is usually further processed with flooding radiation and/or heat to achieve the final properties of the solidified photopolymer.

The described layer deposition process which uses the film 16 to push the polymer 12 into place is very fast. The only resistance to the flow of the liquid photopolymer is the air in front of the polymer and the film engages with the polymer gradually as it is rolling on. Only negligible hydraulic or other resistance is encountered in forming any layer thickness including extremely thin ones. The required rolling and other motions can be made very fast and by automation. For higher speed and simplicity, the photopolymer 24 can be pumped or pushed upwards through space 47 (seen in FIGS. 2 and 3) underneath the film 16.

When the pins 19 are stationary as seen in FIG. 1, the mask 17 should be replaced for each layer even if the mask 17 is reused many times in a row. Fabrication is faster and is easier to automate if the mask 17 and pins 19 are mounted on frame 21 as illustrated in FIGS. 4 and 5. If desired, vacuum can be applied to ports (not shown) in the frame 21 to hold mask 17 in place. When the mask 17 is positioned on top of plate 20 as seen in FIG. 4, a fiberoptic faceplate can be employed as the plate 20 to minimize distortion.

In FIG. 6 an apparatus is shown with a mask 17, as well as, film 16 and dispensing means 36 mounted on irradiation means 30. The irradiation means 30 is moved into position over the substrate 13 by a positioner 35. The dispensing means 36 is preferably as wide as the substrate 13. Unlike the system of FIG. 1, film 16 is separated by sliding and can be permanently attached to plate 20.

The apparatus of FIG. 6 operates similar to that of FIG. 1 with the following differences. A flat photopolymer layer is provided by the movement to the right of irradiation means 30 which spreads and flattens the photopolymer quantity 24. Besides depositing the whole quantity of photopolymer 24 at once, it can be deposited gradually during the movement of means 30. Means 30 is stopped for irradiation in a fixed position to assure alignment of formed layers. Irradiation means 30, including the film 16, is separated from the irradiated layer by sliding it back to the left to the position L seen in FIG. 6.

The apparatus of FIG. 7 is similar to that of FIG. 6 but the film 16 is separated from the irradiated layer by peeling. As seen therein a roll of film 16 on a spool 38 is employed with the free end 45 of the film 16 attached to means 30. A motor or other means for rolling the film on and off the spool 38 and for stretching it to provide a flat surface can be used but are not shown.

The operation of the apparatus of FIG. 7 is similar to that of the apparatus of FIG. 6 but involves the following additional steps needed to provide the peeling of the film 16 off the irradiated layer. Before means 30 starts to move left from position R, additional film 16 is unrolled from spool 38 to prevent film sliding; and plate 13 is dropped down slightly in order to minimize object distortion by the moving means 30 as shown in broken lines in FIG. 7. The travel of the irradiation means 30 back to position L peels the film 16 from the surface of the irradiated polymer. When peeling is completed, the spool 38 is turned to stretch film 16.

The apparatus of FIG. 7, can be provided with means for automatic mask changes that incorporate a roll of film 16 on spools 39 (see bottom view of such irradiation means in FIG. 8) bearing mask patterns in the order of their use in irradiation.

Figure 9:
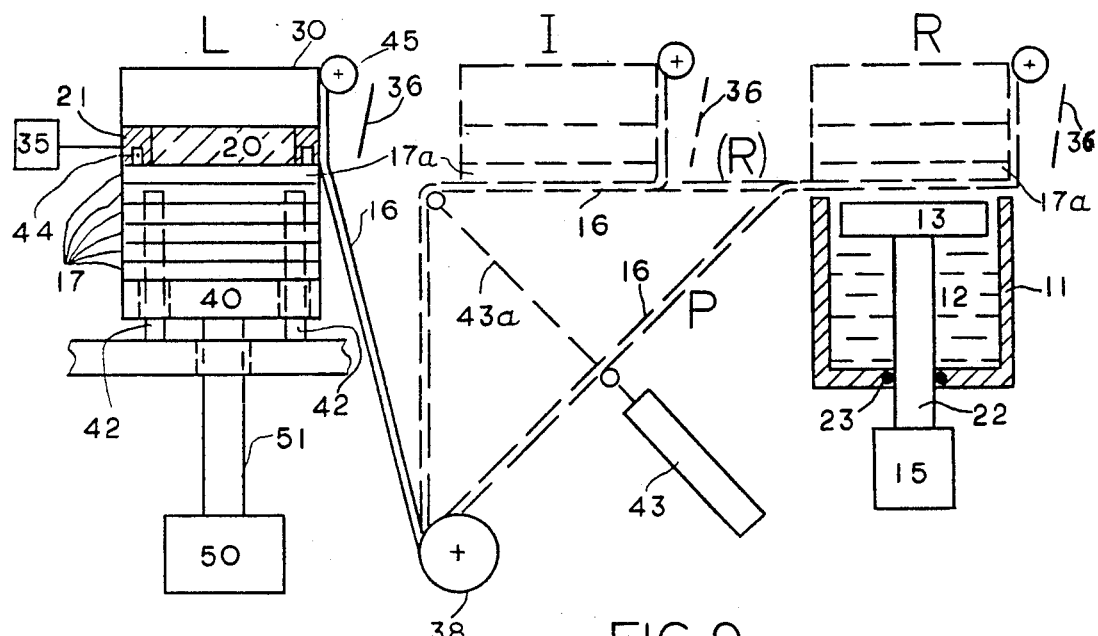
FIG. 9 is a fourth embodiment of my invention.

In FIG. 9 an apparatus is shown employing a prearranged stack of aligned masks 17 to provide automatic mask change. The apparatus also differs from that of FIG. 7 in having spool 38 of film 16 secured below the irradiation means 30 so that plate 20 can be exposed to receive a mask 17 and then the mask 17 covered with the film 16 by use of a linear actuator 43 which both stretches and properly positions the film 16 for photopolymer deposition and irradiation. The roll 38 also stretches the film 16 all the time except when the film 16 is being peeled off. Means for feeding the aligned masks 17 include a movable plate 40 the top of which is parallel to bottom surface of the irradiation means 30. It also includes stationary pins 42 the tops of which terminate below the bottom plate 20 by a little more than the thickness of a mask 17, and a positioner 50 with a shaft 51 to vertically move the stack of masks 17 along the guiding pins 42. Additional means to decrease friction on pins 42 and adhesion between masks 17 in the stack can be used, if desired.

The layer forming cycle for the apparatus of FIG. 9 starts with apparatus in the left position (L) for mask loading (the position is fixed to assure eventual alignment of formed layers). First, the stack of masks 17 is moved up into contact with the bottom of plate 20 which takes the top mask 17a off the pins 42. Vacuum is applied to ports 44 to hold the top mask 17a on the plate 20. The plate 40 is then slightly dropped down and irradiation means 30 with mask 17a is moved to the intermediate position (I). In the process film 16 is placed and stretched over the bottom of the mask 17a by the movement of the means 30 and the arm 43a of the actuator 43 to its extended position. Next, the irradiation means 30 is moved to the extreme right (R) position and a layer of photopolymer which has been deposited as described for the apparatus of FIG. 7, is irradiated. After irradiation, the arm 43a of the actuator 43 is retracted and the film 16 is rolled onto spool 38 and the stretching is discontinued to bring the film 16 into position marked P, whereupon the substrate 13 drops slightly and irradiation means 30 move to the left. When irradiation means 30 is back in position I the mask 17a is free of the film 16. If mask 17a has to be changed for the next layer, a pump (not shown) provides air pressure to ports 44 to detach and drop down mask 17a, and the irradiation means 30 returns to position (L) to pick up a new mask. The cycle is repeated for each new layer.

Figure 10:
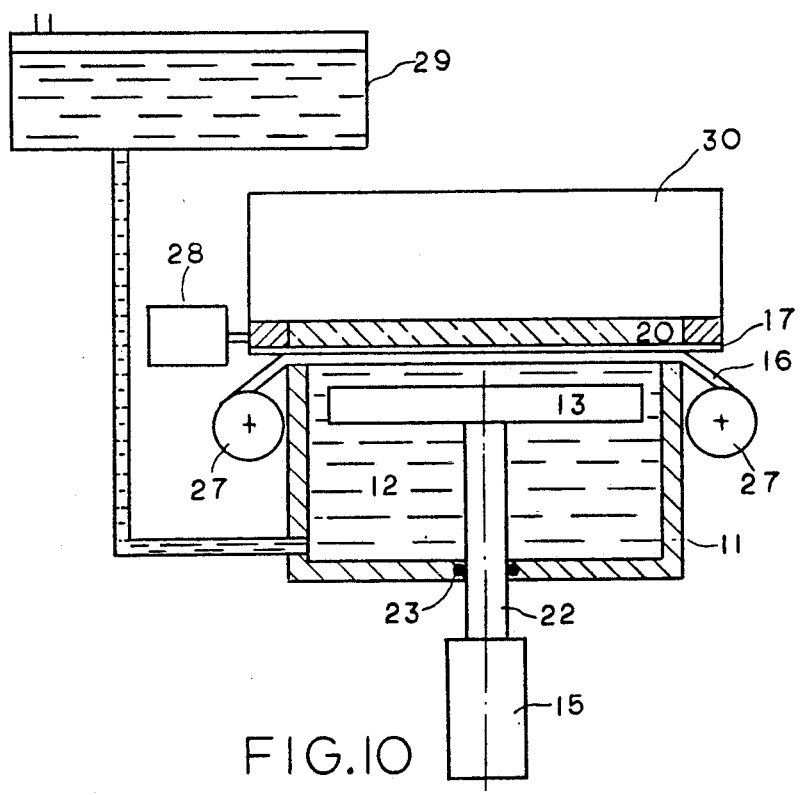
FIG. 10 is an embodiment of my invention in which photopolymer is deposited by pulling the object and flexible film apart in a sealed container; and, FIG. 11 is an embodiment of my invention employing deposition of photopolymer onto irradiation means apart from the object.

In FIG. 10, an apparatus is shown in which container 11 is filled to the top without entrapped gas and tightly covered by film 16, and layer deposition occurs automatically by the flow of polymer with the downward movement of the substrate 13. When a layer of proper thickness is obtained, it is irradiated. To remove the layer or object from the film 16 the substrate 13 is moved down, pulling the film 16 and stretching and separating it gradually from the irradiated object. At the same time liquid polymer 12 is filling the void being created between film 16 and object, and the film 16 is returned to its flat position. The use of the flexible film 16 decreases the pull on the object and its deformation. Low film adhesion to photopolymer and non-wetting properties are important to this apparatus.

In the apparatus of FIG. 10, the film 16 is on rolls 27 provided with a motor and other means (not shown) for stretching the film and sealing the top of the container, and to allow replacement of film that suffered significant nonelastic deformation. In addition plate 20 is equipped with a positioner 28 for positioning it and sealing the container.

To expedite film return and thus decrease its deformation, the container 11 can be pressurized using a second container 29 that preferably has a cross-section many times larger than shaft 22. Alternately, a pump with pressure controls or other suitable means can be used for pressurization and replenishment of container 11.

With the exception of layer deposition, the operation of the apparatus of FIG. 10 is basically similar to that of the apparatus of FIG. 1.

To expedite layer deposition, especially when it is thin, plate 20 can be slightly raised during substrate lowering to allow some bulging of film 16; with pressurization, this may result in some outflow of polymer but will not entrap gas. In an alternative embodiment, no rolls 27 are employed and stretched film 16 is permanently attached to container 11.

Figure 11:
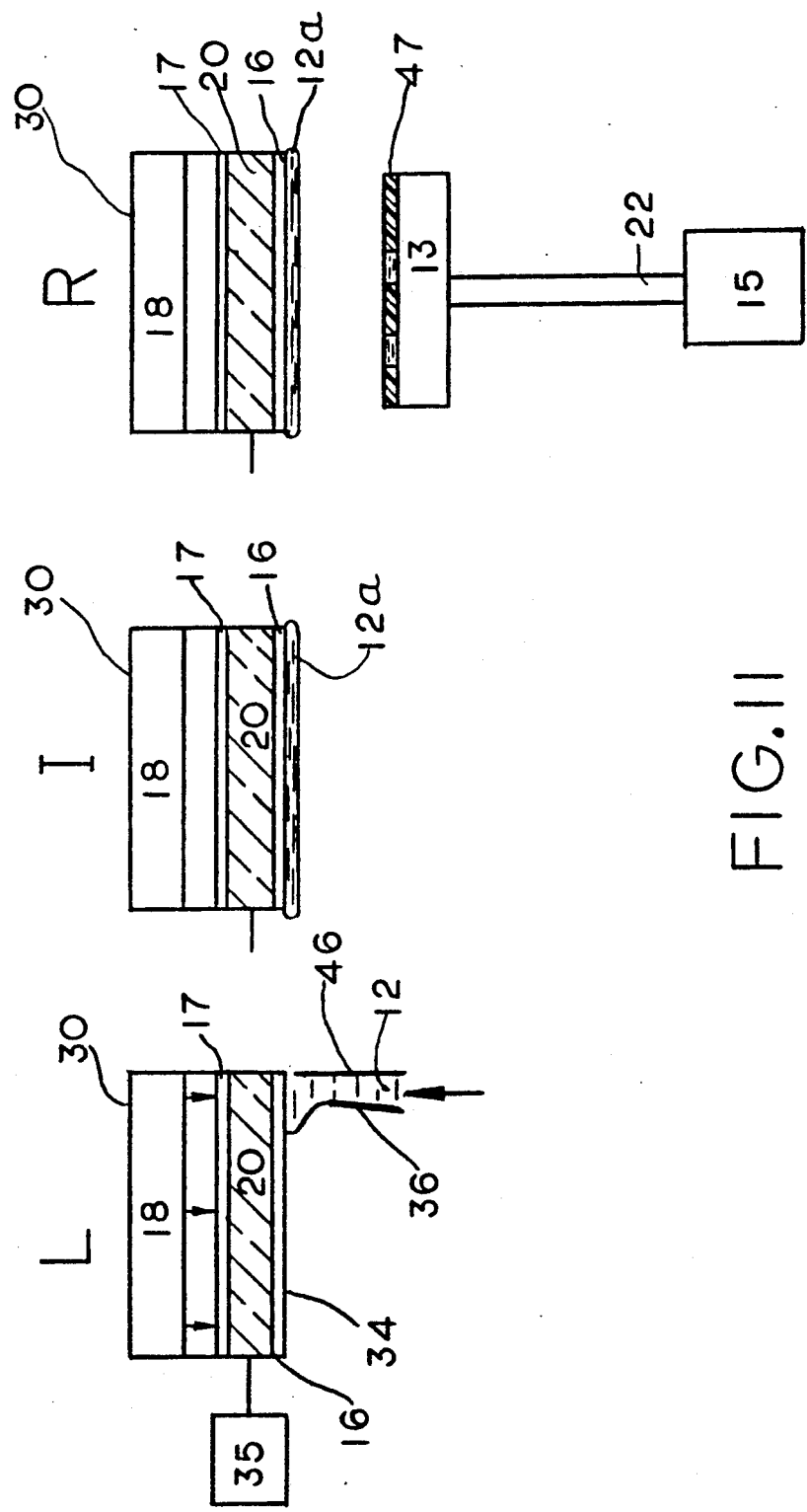

In the apparatus of FIG. 11 the liquid photopolymer 12 is deposited onto the bottom 34 of the film 16 of the irradiation means 30 when it is apart from the object. The apparatus is similar to that of FIG. 6 except that no container 11 is employed, and photopolymer dispensing means 36 is stationary and located below means 30 at a distance exceeding the thickness of layer to be formed. When the irradiation means 30 is passing over dispenser means 36, a layer of photopolymer 12a is being dispensed onto surface 34 of means 30; the layer thickness is determined by the height of the wall 46. As seen in I, a layer 12a of polymer is on the bottom 34 of the irradiation means 30. The layer 12a can be irradiated in this position (I) or moved to position (R) and irradiated. When means 30 with the deposited photopolymer layer 12a are in an irradiation position (R) over the substrate 13, the latter can be raised to bring a previously formed object 47 into contact with (or slightly into) the deposited liquid photopolymer layer, and radiation applied to bind them together. Upon irradiation, irradiation means 30 is slid off to position L, and substrate 13 with the object is dropped down.

Several dispensing means 36 can be employed to provide different polymers for different layers. A mobile film 16 on 2 rolls as in the apparatus of FIG. 10 can be used for replacement of the working portion of film in which case the mask 17 is positioned preferably between plate 20 and film 16.

Important improvements are achieved when either the layer forming radiation is applied before the layer is brought into contact with the object (separate cure), or when the film 16 is of wettable material and it is separated by pulling or peeling that take unsolidified photopolymer off with the film. Since in either case there is no polymer under the layer, it can be fully cured to provide full mechanical strength to each formed layer thus eliminating the need for postcure and for special supports that have to be formed for overhang areas, as well as, the distortion occurring during postcure.

In the case of a separate cure, irradiation should be done in air or another environment that preserves further cross-linking capability of the open bottom surface of the formed layer so that it will subsequently attach to the object. Blotting, dissolving, other means of removing unsolidified photopolymer from the exposed bottom surface of the formed layer without its displacement can be used. After a layer is formed, it is joined with the object, and radiation is reapplied to attach them together. With proper space between means 36 and support 13, layer irradiation apart of object can be done in that space (position I) rather than above the object.

Still referring to FIG. 11, removal of the object from film 16 can be achieved by pulling the substrate 13 down upon irradiation. In order to use peeling, the apparatus of FIG. 11 can use the 2-roll mobile film arrangement of the system of FIG. 7. Drainage and other means of removing liquid polymer from the object as it is formed can be employed.

The apparatus of FIG. 11 can operate in upside down position or, with thin deposited layers, at other angles. In those positions, however, the flow of the unsolidified photopolymer may cause complications.

Separate layer deposition can be used also in apparatus having containers like those on FIGS. 6 and 8.

A preferred photopolymer liquid for use in the present invention is MAGNACRYL 2296 made by Beacon Chemical Company of Mount Vernon, N.Y. Other photopolymers cross-linkable with radiation of different particles and at different wavelengths can be employed. The terms "polymer" and "photo-polymer" as used herein are intended to include all materials, even non-polymer, useful in the disclosed methods and systems.

Preferred material for film 16 is fluorinated ethylene propylene copolymer available in films of various thicknesses from E.I. du Pont of Wilmington, Del. It is wettable by the preferred polymer and radiation transmittent.

Masks can be made of photographic film like Kodak precision line film LPF7 using automatic photoplotters like Gerber Models 3244 or 38. Orifices in the masks 17 for the pins 19 can be made by providing properly positioned optical marks on masks during their photoplotting and subsequent punching or etching. Alternately, optical mask positioning means can be employed instead of pins that require no punching. Automatic mask positioning means can be used that are based on a web or stack of masks as in the apparatus shown in FIGS. 7 and 9.

The plate 20, the mask 17 and radiation source 18 can be substituted with matrix-type irradiation means that contain a great number of densely packed miniature irradiating components-pixels that are individually controlled electronically and create in combination desired irradiation patterns. These so called flat-panel displays or space light modulators are integrally manufactured microelectronic units having a flat radiation-emitting surface that are based on liquid-crystals (LCD), light-emitting diodes (LED), lasers, reflecting mirrors, or the like.

Scanning irradiation means employing point, line or otherwise shaped beams, fixed or modulated in cross-sectional shape/pattern, can be used in irradiation means 30 instead of mask 17 and radiation source 18.

A suitable source of radiation 18 is a parallel array of General Electric tubular fluorescent lamps emitting ultraviolet light in the range of 200 to 500 nm, and preferably about 300 to 400 nm, and providing intensity of about several mw/cm.sq. Single or multiple Mercury or other arc lamps, other sources of simultaneous radiation, sources of sequential irradiation like lasers scanning with point, line or otherwise-shaped beams that emit radiation in the wavelength the photopolymer is sensitive to can be used. In many cases source 18 can be stationary.

Substrate 13 can be of steel or other material which will serve as a suitable support to which the solidified object will attach and will not displace during object formation.

It will be apparent to those skilled in the art that a number of changes can be made without departing from the spirit and scope of the invention. For example, instead of moving the substrate 13 down the irradiation means 30 and container 11, if any, can be moved up as each new layer is formed. Therefore, it is intended that the invention be limited only by the claims.

I claim:

1. In the method of preparing three-dimensional objects from an uncured photopolymer by depositing the photopolymer in layers and treating it with radiation to form successive slices of an object of required configuration and joining said slices together, the improvement which comprises irradiating said uncured photopolymer by transmitting radiation through a transmittent flexible film in contact with the uncured photopolymer, said film being mechanically prevented from bulging during irradiation.

2. The method of claim 1 wherein photopolymer is deposited in a layer covered with said film by applying said photopolymer and moving said film across said object in a spreading fashion whereby said film is simultaneously pushing, spreading and covering said photopolymer.

3. The method of claim 1 wherein said film is made of material preserving subsequent cross-linking capability of the surface of said photopolymer in contact with said film.

4. An apparatus for producing of three-dimensional objects from photopolymer layer by layer by application of modulated radiation solidifying said photopolymer in required configuration, said apparatus comprising:
   (a) means for supporting an object;
   (b) deposition means for depositing onto said object a layer of photopolymer of desired thickness;
   (c) a transmittent flexible film said film covering said layer during irradiation;
   (d) irradiation means for solidifying at least a portion of said layer and attaching it to said object, said irradiation means including limiting means for obstructing bulging of said film during irradiation; and
   (e) separating means for separating said film from said object.

5. An apparatus of claim 4 wherein said irradiation means include a mask and a source of radiation, said mask having an imaging transmittent area for transmitting radiation to areas of said layer to be solidified and alignment means for the proper positioning of said mask during irradiation, said mask including aligning transmittent areas in a preset disposition with said imaging transmittent area.

6. An apparatus of claim 5 wherein said alignment means include pins and the mask has pin-receiving orifices aligning with said pins, said aligning transmittent areas determining the position of said pin-receiving orifices.

7. The apparatus of claim 5 which includes mask stacking means for prestacking masks in the order of mask use in irradiation, said masks having their imaging transmittent areas aligned with one another.

8. An apparatus of claim 4 wherein said deposition means include stretching means for stretching said film.

9. An apparatus of claim 4 wherein said irradiation means include limiting means in contact with said film to obstruct bulging of said photopolymer during irradiation.

10. An apparatus of claim 9 wherein said limiting means is a rigid transmittent plate in contact with said film said plate being provided with means for limiting movement of said plate away from said film.

11. An apparatus of claim 4 wherein said deposition means include supply means for providing photopolymer on top of said object and spreading means for moving one end of said film across said object in a spreading fashion while keeping the other end of said film stationary whereby said photopolymer is pushed, spread and covered with said film.

12. An apparatus of claim 11 wherein said supply means include a dispensing opening, said dispensing opening facing said irradiation means.

13. An apparatus of claim 4 wherein said film is of material that preserves further cross-linking capability of photopolymer in contact with said film.

14. An apparatus of claim 4 wherein said film is made of fluorinated ethylene propylene.

15. An apparatus of claim 4 wherein said separating means include peeling means for folding one end of said film and moving it towards the other end of said film whereby said film is peeled off said photopolymer.

16. An apparatus of claim 4 wherein said separating means include pulling means for separating said film from said object by simultaneous pulling of said film across the whole interface between said film and said object.

17. An apparatus of claim 4 wherein separation means include sliding means for separating said film by simultaneously sliding across the whole interface between said film and said object.

18. An apparatus of claim 4 wherein said deposition means include a container covered tightly with said film and filled to the top with photopolymer, and said separating means include means for pulling said film and said object apart simultaneously across the whole interface between them whereby a vacuum is created and a layer of photopolymer is introduced between said film and said object.

19. An apparatus of claim 18 wherein said irradiation means additionally include film advancing means for replacing said film covering said container.

20. In the method of preparing a three-dimensional object from a photopolymer by depositing a layer of uncured photopolymer upon a layer of cured photopolymer, irradiating said layer of uncured photopolymer to cure it, and joining it to the previously cured layer to form an object, the improvement which comprises pushing uncured photopolymer onto the layer of the previously cured photopolymer by moving a flexible radiation transmittent film in a spreading fashion to spread the uncured photopolymer to form an uncured layer and to cover the layer with the film to protect it during irradiation; irradiating the uncured layer and, then separating said film from the layer.

21. The method of claim 20 wherein said film is made of material preserving the subsequent cross-linking capability of the surface of said photopolymer which is in contact with said film.

22. In the method of producing a three-dimensional object from photopolymer in successive portions by depositing uncured photopolymer in layers, irradiating the layers using irradiation means to form the successive portions, and attaching the successive portions to previously formed portions of the object or to object support means, the improvement which comprises depositing said layers directly onto a surface of said irradiation means spaced apart from said previously formed portions, and repositioning said object support means and said irradiation means for attachment of said successive portions to said previously formed portions.

23. The method of claim 22, wherein unsolidified photopolymer is removed from said formed potions.

24. A method of producing a three-dimensional object from photopolymer in successive portions by depositing uncured photopolymer in a layer, irradiating the layer using irradiation means to form a successive portion, and attaching the successive portion to a previously formed portion of the object or to object support means, which comprises:
(a) forming a portion of said object attached to object support means,
(b) depositing a successive layer of uncured photopolymer directly onto said surface of said irradiation means spaced apart from a said previously formed portion,
(c) irradiating said successive layer while it is spaced apart from said previously formed portion to form a successive portion,
(d) attaching said successive portion to a said previously formed portion, and
(e) separating said surface from said successive portion.

25. Method of claim 24 wherein said attaching of said successive portion to a said previously formed portion includes bringing the portions in contact with proper alignment, and then reirradiating said successive portion.

26. Method of claim 24 wherein said irradiation is conducted in a medium preserving subsequent cross-linking capability of external surfaces of said successive portion.

27. Method of claim 24 wherein said irradiation is conducted in air.

28. A method of producing a three-dimensional object from photopolymer in successive portions by depositing uncured photopolymer in a layer, irradiating the layer using irradiation means to form a successive portion, and attaching the successive portion to a previously formed portion of the object or to object support means, which comprises:
(a) forming a portion of said object attached to object support means,
(b) depositing a successive layer of uncured photopolymer directly onto said surface of said irradiation means spaced apart from a said previously formed portion,
(c) bringing said successive layer and a said previously formed portion into contact,
(d) irradiating said successive layer to form a successive portion of said object and attach it to a said previously formed portion, and
(e) separating said surface from said successive portion.

29. An apparatus for producing a three-dimensional object from photopolymer in successive portions, said apparatus comprising:
(a) object support means for supporting said object as it is formed, (b) irradiation means spaced apart from a previously formed portion of the object for successive irradiation of layers of uncured photopolymer to form successive portions of said object, said irradiation means having a surface, (c) separate photopolymer deposition means for successive deposition directly onto said surface of said irradiation means of said layers of uncured photopolymer, (d) positioning means for mutual repositioning of said object support means and said irradiation means for attachment of said successive portions to previously formed portions, and (e) separating means for separating said surface of said irradiation means and said formed portions of the object.

30. An apparatus of claim 29 and additionally including means for preserving subsequent cross-linking capability of surface of said successive portions that is in contact with said surface of said irradiation means.

31. An apparatus of claim 29 wherein said surface of said irradiation means is covered with fluorinated ethylene propylene.

32. An apparatus of claim 29 wherein said deposition means include several dispensing means for dispensing different photopolymers separately.

33. An apparatus of claim 29 wherein said surface of said irradiation means includes material that is wettable by said photopolymer for removal of unsolidified photopolymer upon irradiation.

34. An apparatus of claim 29 wherein said surface of said irradiation means is made of a mobile film, said film being separated from said formed successive portions by peeling or pulling action.

35. An apparatus of claim 29 wherein said irradiation means include several said surfaces.

36. An apparatus of claim 29 and additionally including means for removal of unsolidified photopolymer from said formed successive portions.

37. In the method of producing a three-dimensional object from photopolymer in successive portions by depositing uncured photopolymer in layers, irradiating the layers using irradiation means to form the successive portions of the object, and attaching the successive portions to a previously formed portion of the object or to object support means, the improvement which comprises forming a portion of said object attached to object support means, depositing a successive layer of uncured photopolymer directly onto said surface of said irradiation means spaced apart from said previously formed portion of the object, irradiating said successive layer to form a successive portion, attaching said successive portion to a said previously formed portion, and then separating said surface from said successive portion.

* * * * *